United States Patent
Tatsukawa

(10) Patent No.: US 7,070,312 B2
(45) Date of Patent: Jul. 4, 2006

(54) LAMP UNIT AND VEHICLE HEADLAMP USING THE SAME

(75) Inventor: Masashi Tatsukawa, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 76 days.

(21) Appl. No.: 10/870,148

(22) Filed: Jun. 18, 2004

(65) Prior Publication Data

US 2004/0257826 A1 Dec. 23, 2004

(30) Foreign Application Priority Data

Jun. 19, 2003 (JP) .................... P.2003-175213

(51) Int. Cl.
*F21S 8/10* (2006.01)
(52) U.S. Cl. .............. 362/545; 362/327; 362/507; 362/511; 362/800
(58) Field of Classification Search ............... 362/545, 362/511, 517, 518, 560, 800, 327, 507; 257/98
See application file for complete search history.

(56) References Cited

U.S. PATENT DOCUMENTS

| 5,173,810 | A | * | 12/1992 | Yamakawa | .................. 359/819 |
| 6,552,368 | B1 | * | 4/2003 | Tamai et al. | .................. 257/98 |
| 6,565,247 | B1 | * | 5/2003 | Thominet | .................. 362/545 |
| 6,960,007 | B1 | * | 11/2005 | Ishida et al. | .................. 362/538 |
| 2003/0016539 | A1 | * | 1/2003 | Minano et al. | ............. 362/347 |
| 2004/0208020 | A1 | * | 10/2004 | Ishida | .................. 362/545 |
| 2004/0223337 | A1 | * | 11/2004 | Ishida | .................. 362/538 |

FOREIGN PATENT DOCUMENTS

JP 2001-351410 A 12/2001
JP 2002-94129 A 3/2002

* cited by examiner

*Primary Examiner*—Ali Alavi
*Assistant Examiner*—Gunyoung T. Lee
(74) *Attorney, Agent, or Firm*—Sughrue Mion., PLLC

(57) ABSTRACT

A lamp unit has a semiconductor light emitting chip 24a and a translucent member 22 which subjects light emitted from the chip 24a to be reflected by front surface 22a and then by rear surface 22b to exit from the front surface 22a. Chip 24a is arranged to face forward such that a lower end thereof crosses an optical axis Ax of the lamp unit 20 at right angles. The front surface 22a of the translucent member 22 is formed from a plane orthogonal to the optical axis Ax, and an optical axis region 22a1 of the front surface is subjected to mirror surface treatment. A rear surface 22b of the translucent member 22 is formed using a paraboloid of rotation whose focal point is a position having symmetry with an illumination center of the chip 24a. The rear surface is subjected to mirror surface treatment.

20 Claims, 12 Drawing Sheets

LAMP UNIT AND VEHICLE HEADLAMP USING THE SAME

BACKGROUND OF THE INVENTION

1. Field of the Invention

The present invention relates to a lamp unit to be used in forming a linear portion of a cut-off line in a vehicle headlamp.

2. Description of the Related Art

As described in, e.g., "Patent Document 1," a conventionally-known vehicle headlamp is structured such that a light distribution pattern having a predetermined cut-off line is formed at an upper end section in a method of scattering reflection control, controlling the light, which is originated from a light source, at the reflector.

Patent Document 2 discloses an optical device structured such that light emitted from a light-emitting chip of a light-emitting diode is once reflected on the front surface of a sealing resin member and then said reflected light is reflected again on the rear surface of the sealing resin member, thereby thus-reflected light is irradiated forwardly from the front surface of the sealing resin member.

[Patent Document 1]
JP-A-2001-351410
[Patent Document 2]
JP-A-20020-94129

If the optical device described in Patent Document 2 is used as a lamp unit of a vehicle headlamp, the headlamp unit can be downsized in low profile shape.

However, the outline of the light distribution pattern in Patent Document 2 has such a problem in that said outline formed by the light emitted by the optical device is considerably obscure, whereby this optical device can not be properly used as a lamp unit for forming a cut-off line.

The present invention has been conceived in view of the circumstance and provides with a lamp unit—which affords a low profile configuration and can form a clear cut-off line—as a vehicle headlamp for forming a linear portion of a cut-off line.

SUMMARY OF THE INVENTION

The present invention is directed toward achieving the above object by means of using a semiconductor light-emitting element as a light source and arranging a translucent member such that light originating from the light source enters the translucent member, where the light source and the translucent member have characterized arrangements respectively as will be discussed later.

A vehicle headlamp according to the present invention is characterized by a lamp unit to be used for forming a linear portion of a predetermined cut-off line in a vehicle headlamp configured to form a light distribution pattern having the cut-off line at an upper end section of the headlamp, the lamp unit comprising:

a light source formed from a semiconductor light-emitting element having a light-emitting chip whose one side extends linearly; and a translucent member disposed so as to allow entry of light originating from the light source, wherein the light source is arranged so as to face forward such that the one side crosses an optical axis of the lamp unit at right angles with the one side of the light-emitting chip situated at a lower end section of the light-emitting chip;

the translucent member is configured so as to subject incident light emitted form the light source to reflection on a front surface of the translucent member and then reflection on a rear surface of the translucent member and to exit from the front surface of the translucent member;

a front surface of the translucent member is formed from a plane orthogonal to the optical axis, and a rear surface of the translucent member is constituted of a predetermined light reflection control surface formed while taking, as a reference surface, a paraboloid of revolution (hereinafter called a "rotary paraboloid") whose focal point is a position having symmetry with an illumination center of the light source with reference to the front surface of the translucent member; and an area of the front surface of the translucent member located in the vicinity of the optical axis is subjected to mirror surface treatment, and a rear surface of the translucent member is subjected to mirror surface treatment.

A specific shape of the "predetermined cut-off line" is not limited in any specific way. For instance, there can be adopted shapes including a horizontally-extending cut-off line and an oblique cut-off line extending from the horizontal cut-off line in an oblique upward direction, or a shape comprising a pair of horizontal cut-off lines formed in a staggered stepwise pattern.

Any particular limitation is might not be placed on a specific position of the "linear portion of the cut-off line." For instance, there can be adopted a horizontally-extending linear portion and a linear portion obliquely extending at a predetermined angle with reference to the horizontal direction.

No particular limitations are imposed on types of the "semiconductor light-emitting element." For instance, a light-emitting diode or a laser diode can be adopted.

So long as the "light-emitting chip" is formed such that one side of the light-emitting chip extends linearly, no particular limitation is placed on the shape of the light-emitting chip. For instance, a square, a rectangle, a parallelogram, a hexagon, and a semicircle can be adopted.

Any particular limitation might not be placed on a specific shape of "predetermined light reflection control surface formed by means of taking a rotary paraboloid as a reference surface." For instance, there can be adopted a light reflection control surface formed from, e.g., a rotary paraboloid, a light reflection control surface formed from a plurality of reflection elements provided on a rotary paraboloid, and a surface curved by deforming a rotary paraboloid.

The term "mirror surface treatment" is meant that through its processing the mirror reflection surface can be obtained. As a matter of course, mirror surface treatment, or the like, can be performed by means of surface treatment such as deposition of aluminum. However, mirror surface treatment can also be performed by means of affixation of a member having a mirror surface.

As can be seen from the foregoing configuration, a lamp unit according to the present invention has a light source formed from a semiconductor light-emitting element having a light-emitting chip whose one side extends linearly; and a translucent member disposed so as to allow entry of light originating from the light source. The lamp unit is used in a vehicle headlamp for forming a linear portion of a cut-off line. The light source of the lamp unit is arranged so as to face forward such that the one side crosses an optical axis of the lamp unit at right angles with the one side of the light-emitting chip situated at a lower end section of the light-emitting chip. The translucent member is configured such that the incident light emitted from the light source is reflected on a front surface of the translucent member and then reflected on its rear surface to enable the light exit from the front surface of the translucent member. At that time, the front surface of the translucent member is formed from a plane orthogonal to the optical axis, and a rear surface of the translucent member is constituted of a predetermined light reflection control surface formed while taking, as a reference surface, a rotary paraboloid whose focal point is a position having symmetry with an illumination center of the light source with reference to the front surface of the translucent member. Further, an area of the front surface of the translucent member located in the vicinity of the optical axis is subjected to mirror surface treatment, and a rear surface of the translucent member is subjected to mirror surface treatment. The following working-effects can be obtained.

Specifically, the majority of the light emitted from the light source and entered the translucent member reaches the front surface of the translucent member. At that time, the light traveling in a direction that is comparatively close to the optical axis may enter the optical axis region where the mirror surface treatment is performed on its front surface. As a result, the light is reflected from the optical axis region, and the majority of the thus-reflected light enters the rear surface of the translucent member. Of the light emitted from the light source and having entered the translucent member, the light traveling in a direction away from the optical axis enters the front surface of the translucent member at a large incident angle with reference to the front surface of the translucent member. Hence, the majority of the thus-entered light is subjected to internal reflection on the front surface whose reflection is to be projected to the rear surface of the translucent member. At that time, the front surface of the translucent member is formed from a plane orthogonal to the optical axis. Hence, the light entering the rear surface of the translucent member becomes scattered light which takes a position symmetrical to the light-emitting chip with reference to the front surface of the translucent member. However, the rear surface of the translucent member is formed from a predetermined light reflection control surface, the control surface being formed while taking, as a reference surface, a rotary paraboloid whose focal point is placed at the position of a virtual light source. Accordingly, the direction of light which is reflected from the rear surface and exits from the front surface can be controlled with high accuracy.

The light source of the lamp unit is arranged so as to face forward such that the one side crosses an optical axis of the lamp unit at right angles with the one side of the light-emitting chip situated at a lower end section of the light-emitting chip. Hence, the light distribution pattern formed by the light emitted from the lamp unit has a clear cut-off line, produced by means of the reversed image of the one side.

Further, in the lamp unit of the present invention, the light source is constituted of a semiconductor light-emitting element. The lamp unit of the present invention is constituted such that light emitted from the light source is caused to exit forward after having twice undergone reflection within the translucent member. Hence, the lamp unit can be made with a low profile shape.

As mentioned above, according to the present invention, a lamp unit which can form a clear cut-off line with a low-profile construction can be obtained as a lamp unit to be used in the vehicle headlamp for forming a linear portion of the cut-off line.

In the lamp unit of the present invention, the optical axis region of the front surface of the translucent member is treated with mirror surface treatment on its surface. Hence, the light emitted from the light source can be prevented from being radiated forward of the lamp unit as upwardly-oriented direct light. As a result, a driver in an on-coming vehicle or the like can be protected from glare.

In relation to the foregoing configuration, the light reflection control surface constituting the rear surface of the translucent member is formed so as to scatter, deflect, or reflect the light entering the light reflection control surface in a direction parallel to one side of the light-emitting chip. In such a case, a light-distribution pattern extending long along the cut-off line is formed. As a result, a clear cut-off line can be stably formed, and a luminous intensity distribution achieved in the vicinity of the cut-off line of the light-distribution pattern can be readily set to a desired luminous intensity distribution.

Here, the expression "scattered, deflected, or reflected in a direction parallel to one side of the light-emitting chip" signifies any of the group comprising: scattering of the reflected light in a direction parallel to one side of the light-emitting chip, deflection of the reflected light in a direction parallel to one side of the light-emitting chip, and simultaneous scattering and deflection of the reflected light.

In the foregoing configuration, no particular limitations are placed on the size and shape of the "optical axis region" of the front surface of the translucent member with mirror surface treatment. When the position of the outer periphery of the "optical axis region" is set such that an angle at which the light emitted from the light source enters the front surface of the translucent member assumes a value substantially equal to a critical angle of the translucent member, the light reflected from the rear surface of the translucent member is not shielded more than necessary, by virtue of presence of the optical axis region. Substantially all the light which is emitted from the light source and enters the front surface of the translucent member can be reflected by the front surface. As a result, a utilization efficiency of a luminous flux can be enhanced.

In many cases, the light source constituted of a semiconductor light-emitting element is configured to have a sealing resin member to be used for sealing a light-emitting chip. The translucent member can also be formed from the sealing resin member. In this case, the lamp unit can be configured as a light source unit with relatively simple configuration. Further, an air layer can be prevented from being interposed between the light source and the translucent member. Hence, a luminous flux from the light source can be utilized effectively.

If the vehicle headlamp is configured to have a plurality of lamp units of the present invention, an attempt can provide with the entire vehicle headlamp in low profile shape.

In such a case, one of the plurality of the lamp units is configured as a horizontal cut-off line formation lamp unit having, as the light source, a light source arranged such that one side of the light-emitting chip extends horizontally; and at least another one of the plurality of the lamp units is configured as an oblique cut-off line formation lamp unit in which the one side of the light-emitting chip extends in a direction tilted at a predetermined angle with respect to a horizontal direction. There can be obtained a light distribution pattern which is suitable for a vehicle headlamp having, at an upper end section thereof, a horizontal cut-off line and an oblique cut-off line.

DESCRIPTION OF THE PREFERRED EMBODIMENTS

An embodiment of the present invention will be described below by reference to the drawings.

Figure 1:
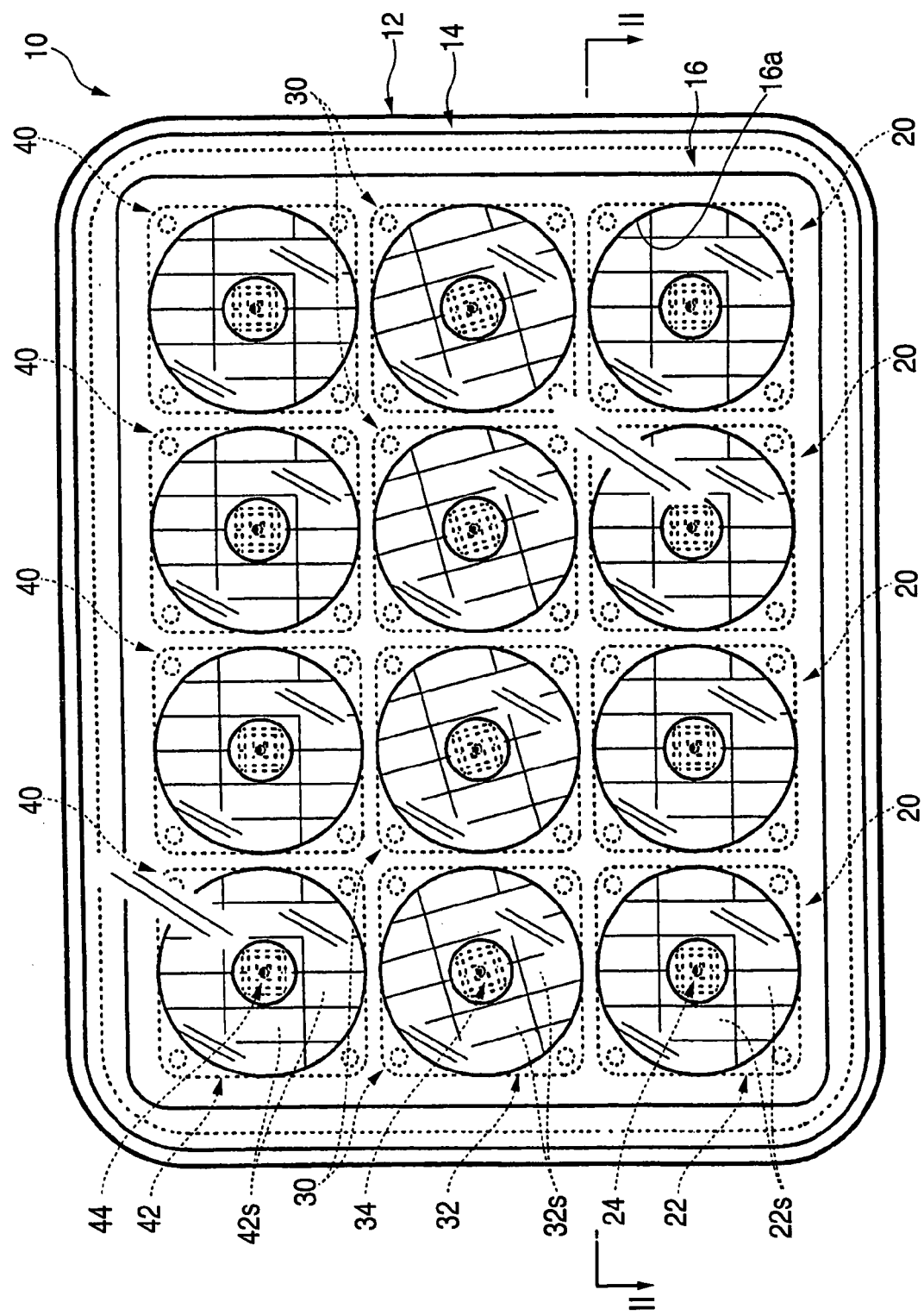
FIG. 1 is a front view showing a vehicle headlamp according to an embodiment of the present invention.
Figure 2:
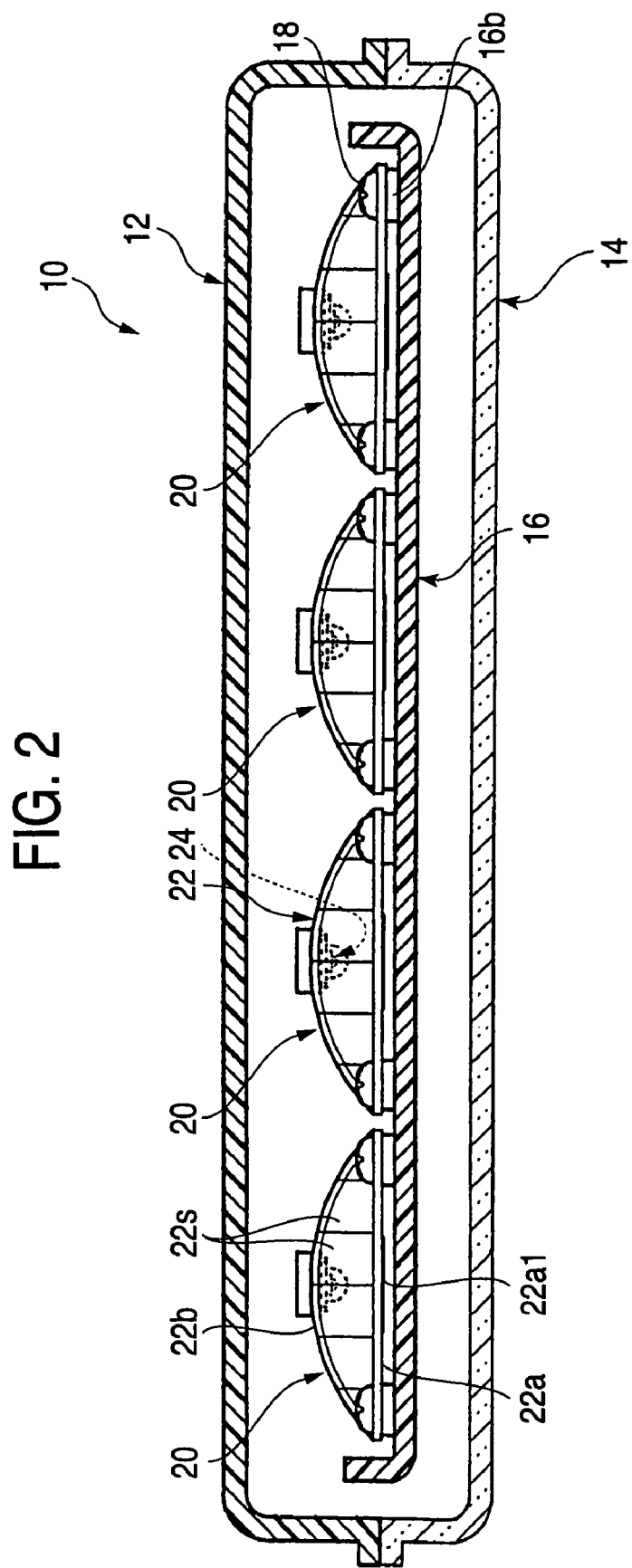
FIG. 2 is a cross-sectional view taken along line II—II shown in FIG. 1.

FIG. 1 is a front view showing a vehicle headlamp according to an embodiment of the present invention. FIG. 2 is a cross-sectional view taken along line II—II shown in FIG. 1.

As illustrated, a vehicle headlamp 10 of the present embodiment is constituted such that twelve lamp units 20, 30, and 40 and a unit holder 16 for supporting the lamp units are housed in a lamp chamber which is formed from a lamp body 12, and a clear translucent cover 14 attached to a front-end opening section thereof.

The twelve lamp units 20, 30, and 40 are arranged vertically in three rows and at substantially uniform intervals. The four lamp units 20, 30, and 40 arranged at the respective rows have similar configurations.

The unit holder 16 is a plate-shaped member which is formed by substantially conforming to the outer shape of the translucent cover 14. This unit holder 16 is supported by the lamp body 12 by way of an unillustrated aiming mechanism, so as to able to tilt in vertical and horizontal directions. Circular opening sections 16a are formed in the unit holder 16 at positions corresponding to the respective lamp units 20, 30, and 40. Rearwardly-projecting bosses 16b are formed at four positions around the respective circular opening sections 16a. A plurality of screws 18 are fastened to the four bosses 16b of the respective lamp units 20, 30, and 40.

Figure 3:
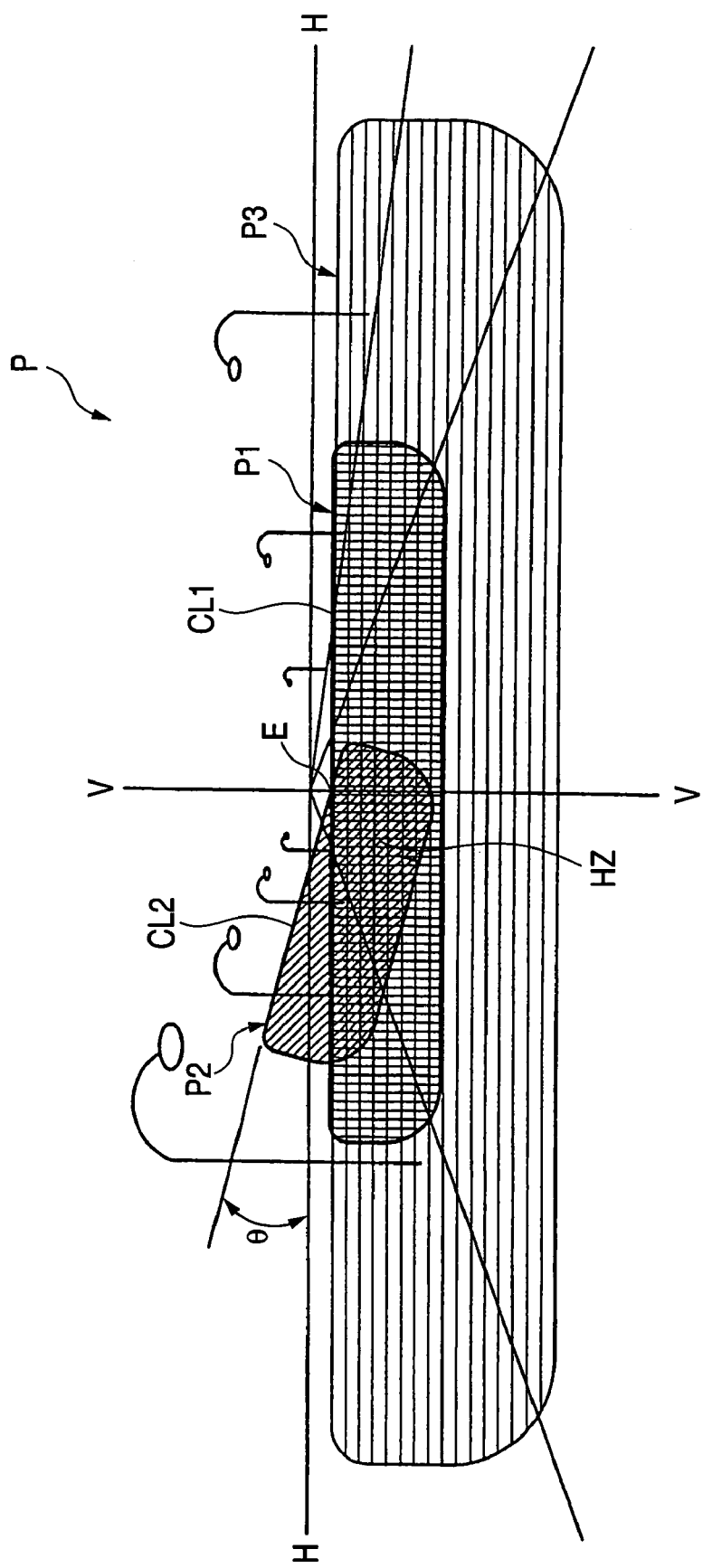
FIG. 3 is a perspective view of a light distribution pattern formed on a virtual vertical screen located at a position 25 m ahead of the lamp, by means of the light forwardly emitted from the vehicle headlamp.

FIG. 3 is a perspective view of a light distribution pattern P formed on a virtual vertical screen located at a position 25 m ahead of the lamp, by means of the light forwardly emitted from the vehicle headlamp 10.

As illustrated, the light distribution pattern P is a low-beam left light distribution pattern having a horizontal cut-off line CL1 extending horizontally at an upper end section and an oblique cut-off line CL2 extending from the horizontal cut-off line CL1 to the upper left at a predetermined angle $\theta°$. The angle $\theta$ is set to a value of about 15°. In the low-beam light distribution pattern P, the position of an elbow point E, which is an intersection between the horizontal cut-off line CL1 and the oblique cut-off line CL2, is set at a position located below a point H-V—which is a vanishing point in the front direction of the lamp—by about 0.5° to 0.6°. A hot zone HZ, which is a high luminous-intensity region, is formed in the vicinity of a lower left position with reference to the elbow point E.

In the embodiment, in an initial state in which the vehicle headlamp 10 is aimed, the unit elbow 16 has been inclined forward by 0.5 to 0.6° with reference to the vertical plane in advance, whereby the position of the elbow point E is set to the foregoing position.

The low-beam light distribution pattern P is formed as a merged light distribution pattern formed from a horizontal cut-off line formation pattern P1, an oblique cut-off line formation pattern P2, and a diffusing region formation pattern P3.

The horizontal cut-off line formation pattern P1 is a light distribution pattern to be used for forming the horizontal cut-off line CL1. The horizontal cut-off line formation pattern P1 is formed from light originating from the four lamp units 20 located in a bottom row. The oblique cut-off line formation pattern P2 is a light distribution pattern to be used for forming the oblique cut-off line CL2. This oblique cut-off line formation pattern P2 is formed from light originating from the four lamp units 30 located in a middle row. The scattering region formation pattern P3 is a light distribution pattern to be used for forming a scattering region of the low-beam light distribution pattern P and forming the horizontal cut-off line CL1 in an auxiliary manner. This scattering region formation pattern P3 is formed from the light originating from the four lamp units 40 located in a top row.

Figure 4:
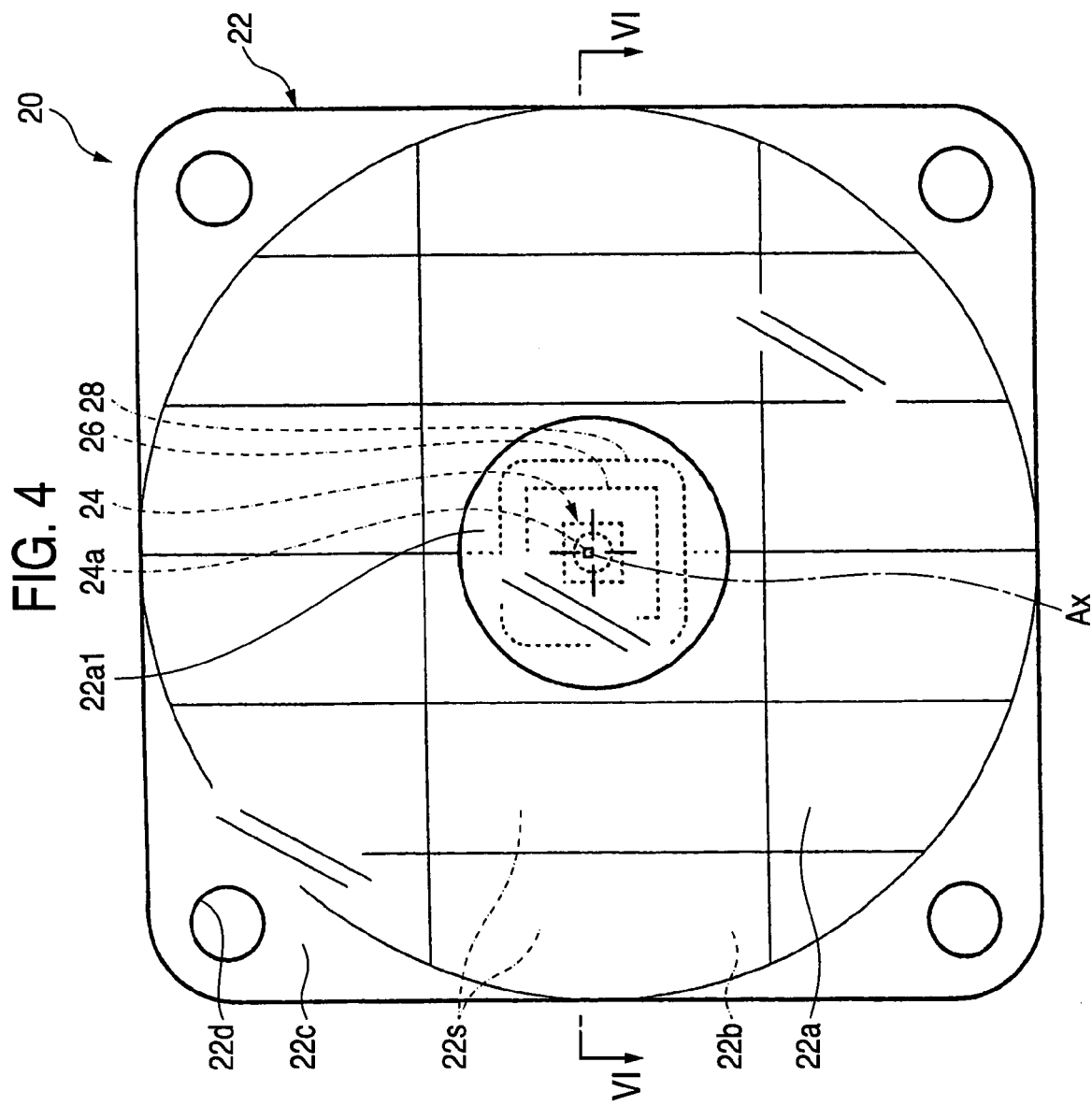
FIG. 4 is a front view showing a single piece of the four lamp units situated in the bottom row.
Figure 5:
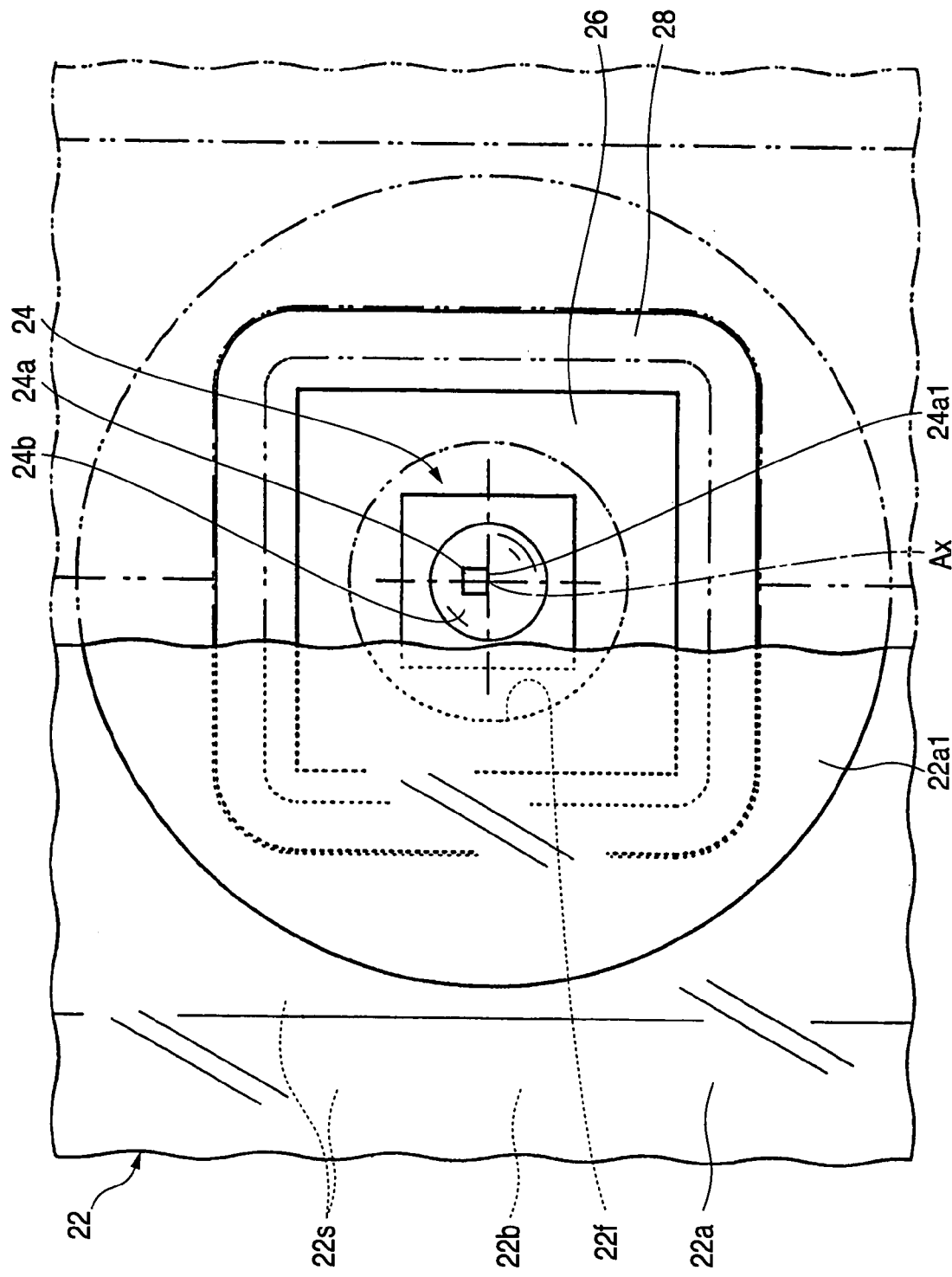
FIG. 5 is a detailed view of the principal section of the lamp unit shown in FIG. 4.
Figure 6:
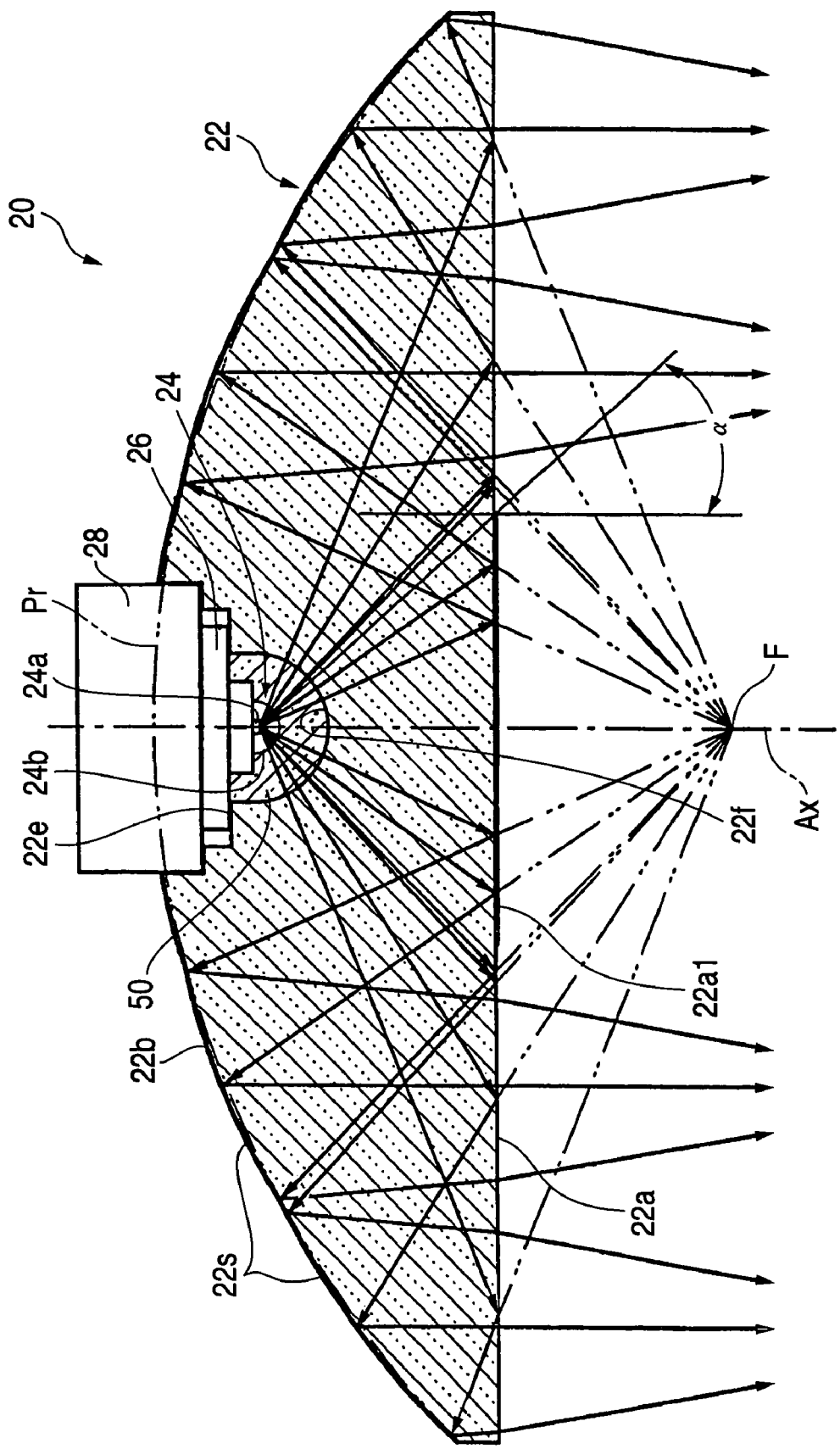
FIG. 6 is a cross-sectional view taken along line VI—VI shown in FIG. 4.

FIG. 4 is a front view showing a single piece of the four lamp units 20 situated in the bottom row. FIG. 5 is a detailed view of the principal section of the lamp unit shown in FIG. 4. FIG. 6 is a cross-sectional view taken along line VI—VI shown in FIG. 4.

As shown in these drawings, each of the lamp units 20 located in the bottom row comprises a light source 24 formed from a light-emitting diode; a translucent member 22 arranged so as to cause the light originating from the light source 24 to enter the lamp unit; and a support block 28 for supporting the light source 24 by way of a board 26. The lamp unit 20 has an optical axis Ax extending in a longitudinal direction of the vehicle.

In the light source 24, a square light-emitting chip 24a is sealed with a semi-circular sealing resin member 24b. The light source 24 is arranged so as to face forward while one side 24a1 of the light-emitting chip 24a extends horizontally at the lower end section of the light-emitting chip 24a and is caused to cross the optical axis Ax at right angles.

The translucent member 22 is formed from a synthetic resin mold such as an acrylic resin mold. The translucent member 22 is structured so as to subject the incident light emitted form the light source 24 to reflection on a front surface 22a of the translucent member 22 and then reflection on a rear surface 22b of the translucent member 22 and to exit from the front surface 22a of the translucent member 22.

The front surface 22a of the translucent member 22 is formed from a plane orthogonal to the optical axis Ax. Of the front surface 22a, an area 22a1 located in the vicinity of the optical axis (called an "optical axis region 22a1") is subjected to mirror surface treatment by means of deposition of aluminum or the like. The optical axis region 22a1 having undergone mirror surface treatment is formed into a circular region centered on the optical axis Ax in the front surface 22a of the translucent member 22. The position of the outer periphery of the optical axis region 22a1 is set to a position where an incident angle of the light that has originated from the light source 24 and entered the front surface 22a of the translucent member 22 becomes substantially equal to a critical angle α of the translucent member 22.

The rear surface 22b of the translucent member 22 is constituted of a predetermined light reflection control surface which is formed in accordance with a reference surface of a rotary paraboloid Pr. In the rotary paraboloid Pr, a position which is symmetrical with the illumination center of the light source 24 with reference to the front surface 22a of the translucent member 22 is taken as a focal point F. The entirety of the rear surface 22b is subjected to mirror surface treatment, such as deposition of aluminum. The light reflection control surface is formed by arranging a plurality of reflection elements 22s in a longitudinal grid pattern. The light that has originated from the light source 24 and has entered the rear surface 22b after having been reflected from the front surface 22a of the translucent member 22 is scattered and reflected in a direction parallel to the side 24a1 of the light-emitting chip 24a (i.e., a horizontal direction). At this time, each of the reflection elements 22s is formed from a curved surface which is slightly larger in horizontal curvature radius than the rotary paraboloid Pr. As a result, a scattering angle is set to a comparatively small value.

A light source mount concaved section 22e to be used for mounting the light source 24 is formed in the rear surface 22b of the translucent member 22. A semi-spherical concaved section 22f which surrounds the illumination center of the light source 24 in a semi-spherical manner is formed in the center of the light source mount concaved section 22e. Internal space of the semi-spherical concaved section 22f is filled with transparent resin 50, such as epoxy resin.

Four tabs 22c are formed along an outer periphery of the translucent member 22 at intervals of 90°, and screw insert holes 22d are formed in the respective tabs 22c. The screws 18 are inserted into the respective screw insert holes 22d, thereby fastening the respective tabs 22c to the respective bosses 16b of the unit holder 16. The lamp unit 20 is attached to the unit holder 16 while the side 24a1 of the light-emitting chip 24a is positioned so as to extend horizontally.

Figure 7:
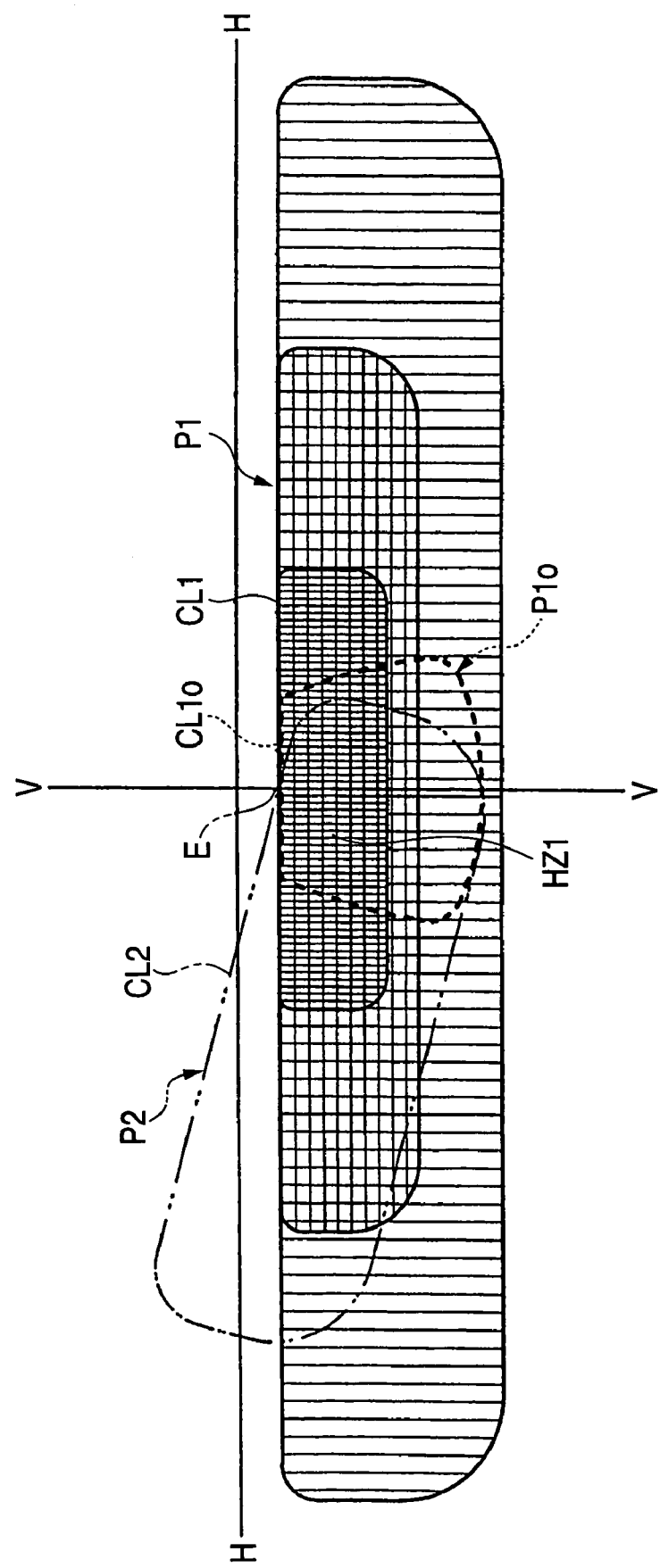
FIG. 7 is a view showing the horizontal cut-off line formation pattern formed on the virtual vertical screen by means of the light emitted forward from the respective lamp units located in the bottom row.

FIG. 7 is a view showing the horizontal cut-off line formation pattern P1 formed on the virtual vertical screen by means of the light emitted forward from the respective lamp units 20 located in the bottom row. The horizontal cut-off line formation pattern P1 shown in FIG. 3 is formed from four lamp units 20. Hence, the horizontal cut-off line formation pattern P1 shown in FIG. 3 is formed as a result of superimposition of four horizontal cut-off line formation patterns P1, each being shown in FIG. 7.

A light distribution pattern P1o designated by broken lines in FIG. 7 is a fundamental light distribution pattern formed when the light reflection control surface constituting the rear surface 22b of the translucent member 22 is assumed to be taken as the rotary paraboloid Pr. The horizontal cut-off line formation pattern P1 is formed as a result of the fundamental light distribution pattern P1o being horizontally scattered by means of the plurality of reflection elements 22s.

At this time, a contour of the upper end section of the fundamental light distribution pattern P1o is formed as an inverted image of the 24a1 of the light-emitting chip 24a which extends horizontally so as to cross the optical axis Ax at right angles; that is, a horizontally-extending clear cut-off line CL1o. A contour of the remaining portions of the fundamental light distribution pattern P1o becomes somewhat obscure. In the fundamental light distribution pattern P1o, a part of the pattern closer to the elbow point E become brighter.

Consequently, the horizontal cut-off line formation pattern P1o obtained as a result of horizontal scattering of the fundamental light distribution pattern P1o becomes a laterally-long light distribution pattern having at the upper end section thereof the horizontal cut-off line CL1 and a hot zone HZ1 in the vicinity of the elbow point E.

Figure 8:
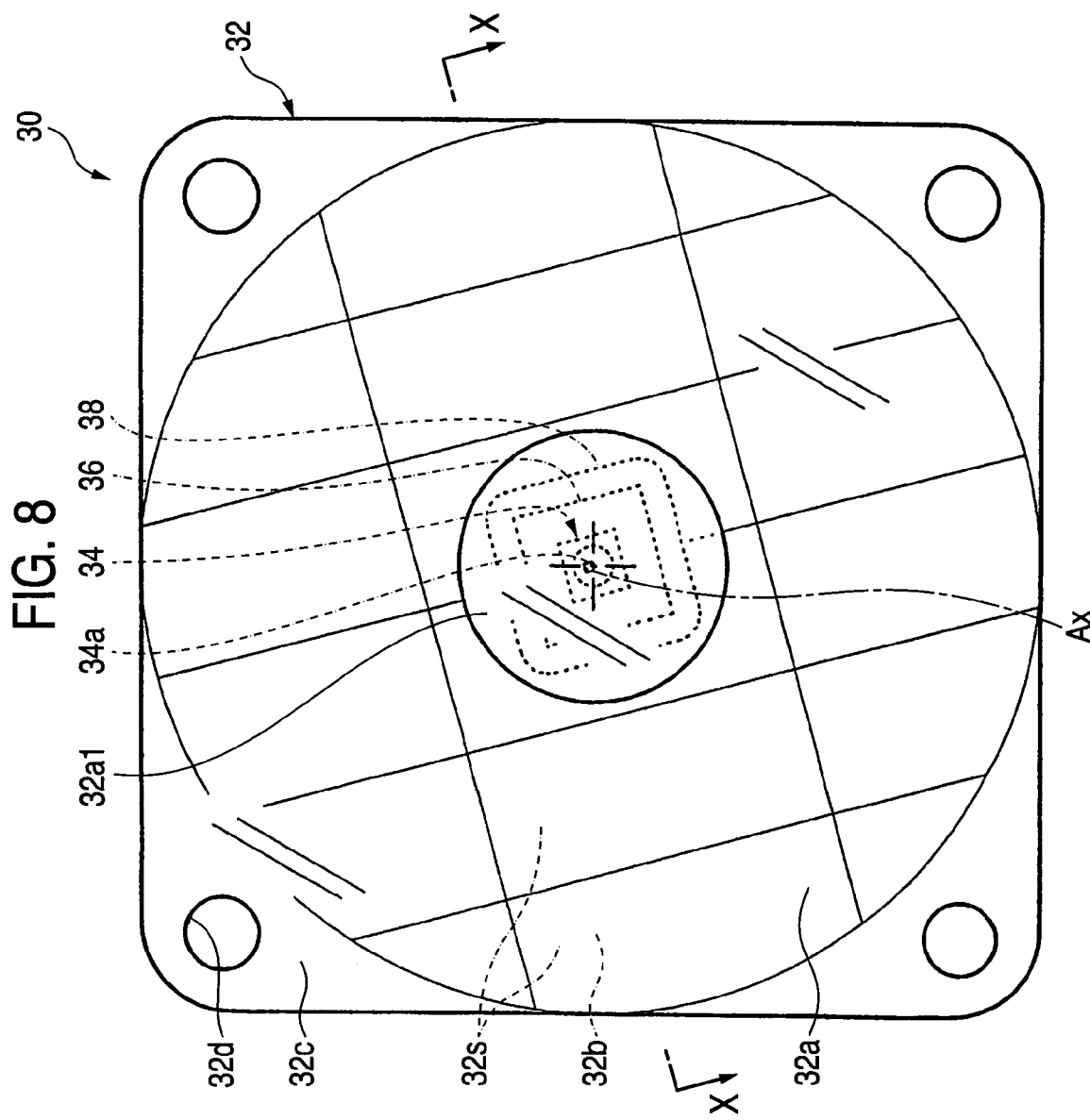
FIG. 8 is a front view showing a single piece of the four lamp units located in the middle row.
Figure 9:
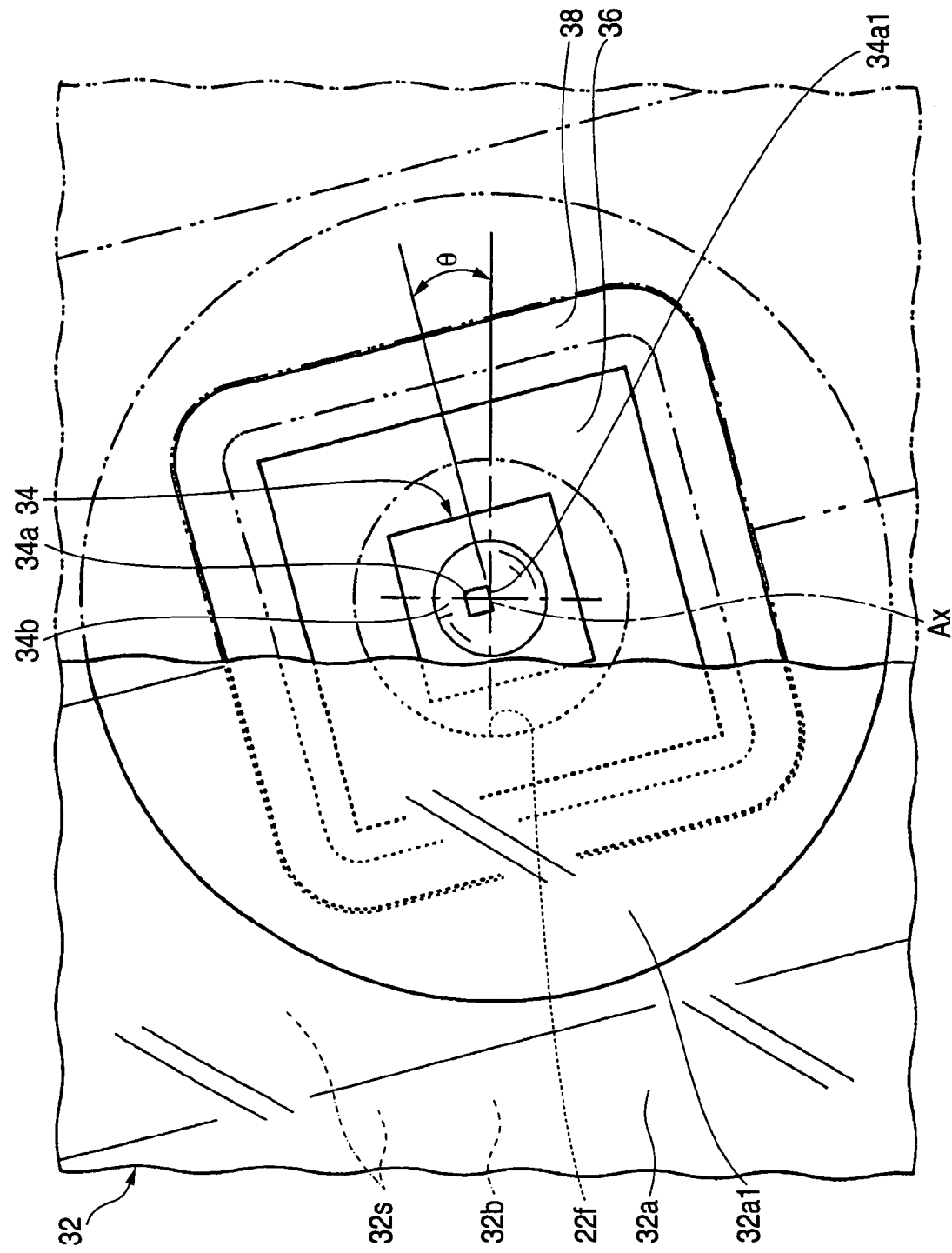
FIG. 9 is a detailed view of the principal section of the lamp unit shown in FIG. 8.
Figure 10:
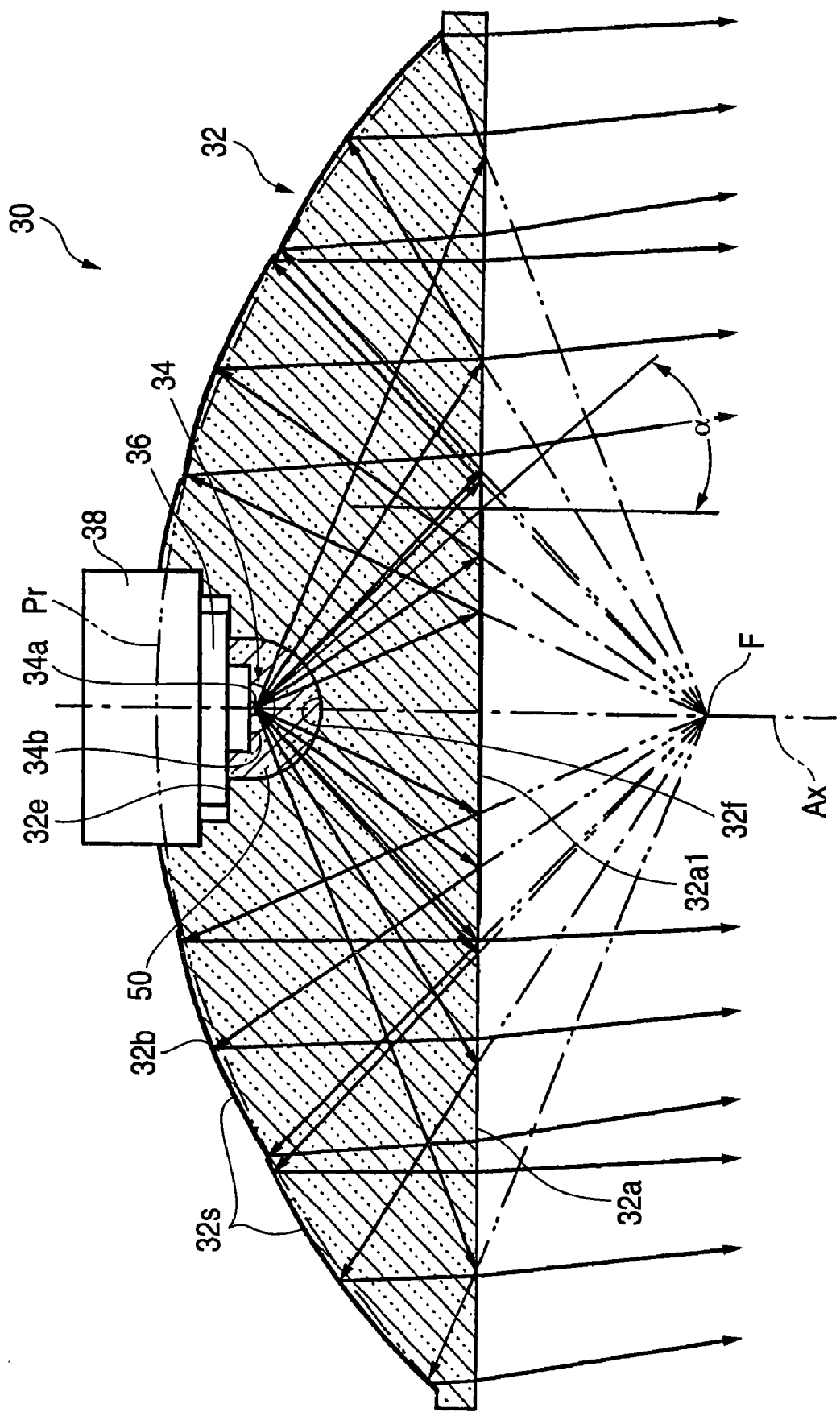
FIG. 10 is a cross-sectional view of the lamp unit taken along line X—X shown in FIG. 8.

FIG. 8 is a front view showing a single piece of the four lamp units 30 located in the middle row. FIG. 9 is a detailed view of the principal section of the lamp unit shown in FIG. 8. FIG. 10 is a cross-sectional view of the lamp unit taken along line X—X shown in FIG. 8.

As illustrated in the drawings, each of the lamp units 30 situated in the middle row comprises a light source 34 formed from a light-emitting diode; a translucent member 32 arranged so as to enable entrance of the light originating from the light source 34; and a support block 38 for supporting the light source 34 by way of a board 36. The lamp unit 30 has an optical axis Ax extending in the longitudinal direction of the vehicle.

In the light source 34, a square light-emitting chip 34a is sealed with a semi-circular sealing resin member 34b. The light source 34 is arranged so as to face forward while one side 34a1 of the light-emitting chip 34a is caused to cross the optical axis Ax at right angles while extending to the upper right at the lower end section of the light-emitting chip 34a at an angle θ with respect to the horizontal direction when viewed in the front of the lamp.

The translucent member 32 is formed from a synthetic resin mold such as an acrylic resin mold. The translucent member 32 is structured so as to subject the incident light emitted form the light source 34 to reflection on a front surface 32a of the translucent member 32 and then reflection on a rear surface 32b of the translucent member 32 and to exit from the front surface 32a of the translucent member 32.

The front surface 32a of the translucent member 32 is formed from a plane orthogonal to the optical axis Ax. Of the front surface 32a, an area 32a1 located in the vicinity of the optical axis (called an "optical axis region 32a1") is subjected to mirror surface treatment by means of deposition of aluminum or the like. The optical axis region 32a1 having undergone mirror surface treatment is formed into a circular region centered on the optical axis Ax in the front surface 32a of the translucent member 32. The position of the outer periphery of the optical axis region 32a1 is set to a position where an incident angle of the light that has originated from the light source 34 and entered the front surface 32a of the translucent member 32 becomes substantially equal to a critical angle α of the translucent member 32.

The rear surface 32b of the translucent member 32 is constituted of a predetermined light reflection control surface formed while taking, as a reference surface, the rotary paraboloid Pr. In the rotary paraboloid Pr, a position which is symmetrical to the illumination center of the light source 34 with reference to the front surface 32a of the translucent member 32 is taken as a focal point F. The entirety of the rear surface 32b is subjected to mirror surface treatment, such as deposition of aluminum. The light reflection control surface is formed by arranging a plurality of reflection elements 32s in a longitudinal grid pattern which extends in a direction orthogonal to the direction of the angle θ. The light that has originated from the light source 34 and has entered the rear surface 32b after having been reflected from the front surface 32a of the translucent member 32 is scattered and reflected in a direction parallel to the side 34a1 of the light-emitting chip 34a (i.e., in the direction of the angle θ). At this time, each of the reflection elements 32s is formed such that a curved surface which is slightly larger in horizontal curvature radius than the rotary paraboloid Pr is somewhat tilted in an upper left direction (an upper right direction when viewed in the front of the lamp) with reference to the direction of the angle θ. As a result, after the scattering angle is set to a comparatively small value, the direction of the light exiting from the front surface 32a of the translucent member 32 is deflected in an upper left direction along the direction of the angle θ.

A light source mount concaved section 32e to be used for mounting the light source 34 is formed in the rear surface 32b of the translucent member 32. A semi-spherical concaved section 32f which surrounds the illumination center of the light source 34 in a semi-spherical manner is formed in the center of the light source mount concaved section 32e. Internal space of the semi-spherical concaved section 32f is filled with transparent resin 50, such as epoxy resin.

Four tabs 32c are formed along an outer periphery of the translucent member 32 at intervals of 90°, and screw insert holes 32d are formed in the respective tabs 32c. The screws 18 are inserted into the respective screw insert holes 32d, thereby fastening the respective tabs 32c to the respective bosses 16b of the unit holder 16. The lamp unit 30 is attached to the unit holder 16 while the side 34a1 of the light-emitting chip 34a is positioned so as to extend in the direction of the angle θ orthogonal to the optical axis Ax.

Figure 11:
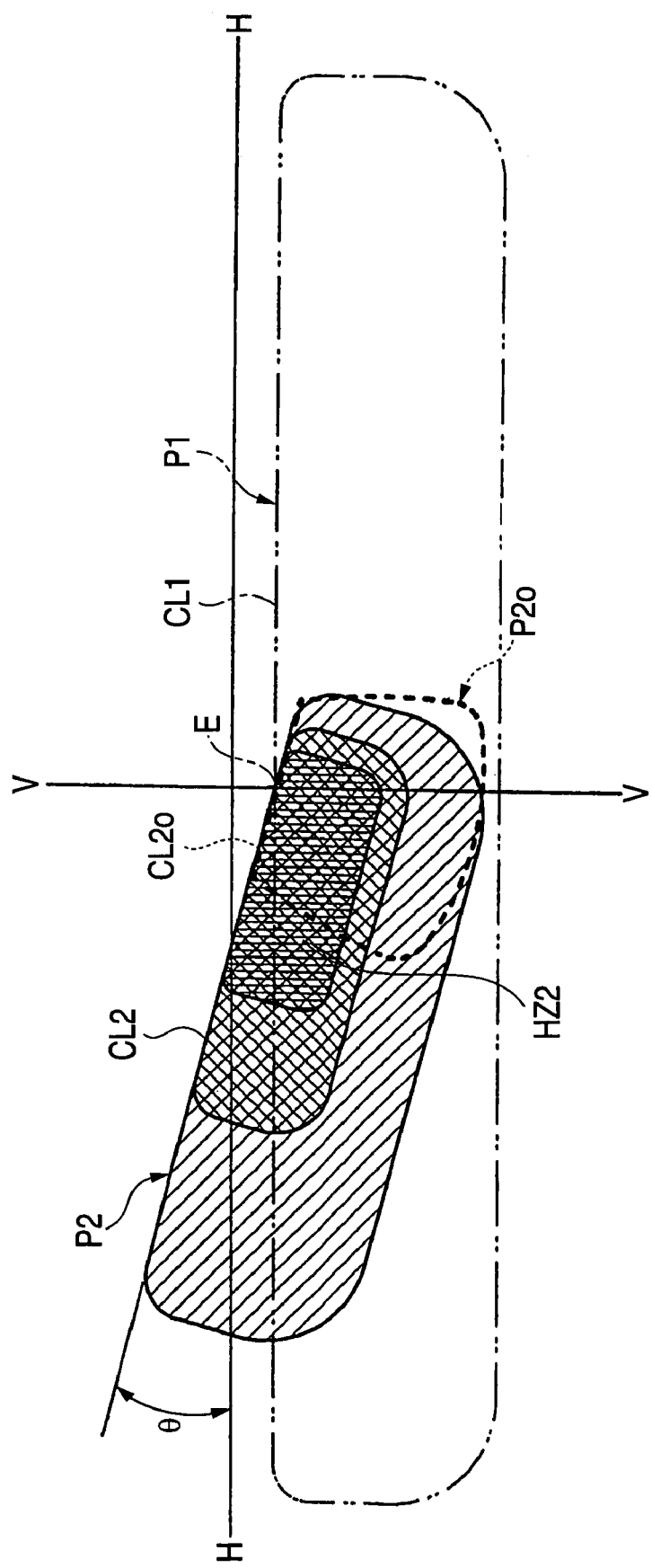
FIG. 11 is a view showing the oblique cut-off line formation pattern formed on the virtual vertical screen by means of the light emitted forward from the respective lamp units located in the middle row.

FIG. 11 is a view showing the oblique cut-off line formation pattern P2 formed on the virtual vertical screen by means of the light emitted forward from the respective lamp units 30 located in the middle row. The oblique cut-off line formation pattern P2 shown in FIG. 3 is formed from four lamp units 30. Hence, the oblique cut-off line formation pattern P2 shown in FIG. 3 is formed as a result of superimposition of four oblique cut-off line formation patterns P2, each being shown in FIG. 11.

A light distribution pattern P2o designated by broken lines in FIG. 11 is a fundamental light distribution pattern formed when the light reflection control surface constituting the rear surface 32b of the translucent member 32 is assumed to be taken as the rotary paraboloid Pr. The oblique cut-off line formation pattern P2 is formed as a result of the fundamental light distribution pattern P2o being scattered by means of the plurality of reflection elements 32s.

At this time, a contour of the upper end section of the fundamental light distribution pattern P2o is formed as an inverted image of the side 34a1 of the light-emitting chip 34a extending in the direction of the angle θ so as to cross the optical axis Ax at right angles; that is, a clear cut-off line CL2o extending in the direction of the angle θ. A contour of the other portions of the fundamental light distribution pattern P2o becomes somewhat obscure. In the fundamental light distribution pattern P2o, a portion of the pattern closer to the elbow point E become brighter.

Consequently, the horizontal cut-off line formation pattern P2o obtained as a result of upper leftward scattering of the fundamental light distribution pattern P2o in the direction of the angle θ becomes a laterally and obliquely long light distribution pattern having at the upper end section thereof the oblique cut-off line CL2 and a hot zone HZ2 in the vicinity of the elbow point E.

As shown in FIG. 1, the lamp units 40 situated in the upper row are configured in substantially the same manner as are the lamp units 20 situated in the bottom row. Specifically, each lamp unit 40 comprises a light source 44 made of a light-emitting diode, and a translucent member 42 located so as to cause the light originating from the light source 44 to enter the lamp unit.

The light source 44 has a configuration and arrangement in the ways completely same as those adopted by the light source 24 of the lamp unit 20.

The translucent member 42 is also configured in completely the same manner as is the translucent member 22 of the lamp unit 20, except that a plurality of reflection elements 42s are formed on the rear surface of the translucent member.

Specifically, in the translucent member 42, the horizontal curvature radius of each reflection element 42s is set so as to become somewhat larger than that of each reflection element 22s of the translucent member 22 of the lamp unit 20. The angle at which the light originating from the translucent member 42 is horizontally scattered is set to a comparatively large value. As a result, as shown in FIG. 3, there is formed the wide-scattering region formation pattern P3 whose upper end section extends horizontally along the cut-off line CL1.

Working-effects of the present embodiment will now be described.

In the lamp unit 20 of the present embodiment, the majority of the light emitted from the light source 24 and entered the translucent member 22 reaches the front surface 22a of the translucent member. At that time, the light traveling in a direction which is comparatively close to the optical axis Ax enters the optical axis region 22a1 with mirror surface treatment on the surface. As a result, the light is reflected from the optical axis region 22a1, and the majority of the thus-reflected light enters the rear surface 22b of the translucent member 22. Of the light emitted from the light source 24 and having entered the translucent member 22, the light traveling in a direction distant from the optical axis Ax enters the front surface 22a of the translucent member 22 at a large incident angle with reference to the front surface of the translucent member. Hence, the majority of the thus-entered light is subjected to internal reflection on the front surface 22a, to thus enter the rear surface 22b of the translucent member 22. At that time, the front surface 22a of the translucent member 22 is formed from a plane orthogonal to the optical axis. Hence, the light entering the rear surface 22b of the translucent member 22 becomes scattered light which takes a position symmetrical to the light-emitting chip 24a with reference to the front surface 22a of the translucent member 22. However, the rear surface 22b of the translucent member 22 is formed from a predetermined light reflection control surface, the control surface being formed while taking, as a reference surface, a rotary paraboloid Pr whose focal point F is placed at the position of a virtual light source. Accordingly, the direction of light which is reflected from the rear surface 22b and exits from the front surface 22a can be controlled with high accuracy.

The light source 24 of the lamp unit 20 of the present embodiment is arranged so as to face forward such that the one side 24a1 crosses the optical axis Ax of the lamp unit 20 at right angles with the one side 24a1 of the light-emitting chip 24a situated at a lower end section of the light-emitting chip 24a. Hence, the light distribution pattern formed by the light emitted from the lamp unit 20 has a clear cut-off line cL1, produced by means of the reversed image of the one side 24a1.

Further, in the lamp unit 20 of the present invention, the light source 24 is constituted of a semiconductor light-emitting element. The lamp unit 20 of the present invention is constituted such that light emitted from the light source is caused to exit forward after having twice undergone reflection within the translucent member 22. Hence, the lamp unit 20 can be made with a low profile shape.

As mentioned above, according to the present invention, in the vehicle headlamp 10 formed so as to form, at an upper end section thereof, a low beam light distribution pattern P having a horizontal cutoff line CL1 and an oblique cutoff line CL2, a lamp unit which can form a clear cut-off line CL1 with a low-profile construction can be obtained as a lamp unit to be used for forming a linear portion of the cut-off line CL1.

In the present embodiment, the optical axis region 22a1 of the front surface 22a of the translucent member 22 with mirror surface treatment on the surface. Hence, the light emitted from the light source 24 can be prevented from being radiated forward of the lamp unit 20 as upwardly-oriented direct light. As a result, a driver in an on-coming vehicle or the like can be protected from glare.

In relation to the present embodiment, the light reflection control surface constituting the rear surface 22b of the translucent member 22 is formed from a plurality of reflection elements 22s which scatter, deflect, or reflect the light entering the light reflection control surface in a direction parallel to the one side 24a1 of the light-emitting chip 24a. Hence, by means of a light-distribution pattern extending long along the cut-off line formed by the light reflection control surface, the clear cut-off line CL1 can be formed stably. Further, the luminous distribution achieved in the vicinity of the horizontal cut-off line CL1 of the low beam light distribution pattern P can be readily set to a desired luminous intensity distribution.

In the foregoing configuration, the optical axis region 22a1 of the front surface 22a of the translucent member 22 with the mirror surface treatment is formed into a circle.

The position of the outer periphery of the optical axis region is set such that an angle at which the light emitted from the light source 24 enters the front surface 22a of the translucent member 22 assumes a value substantially equal to a critical angle α of the translucent member, the light reflected from the rear surface 22b of the translucent member 22 is not shielded more than necessary, by virtue of presence of the optical axis region 22a1. Substantially all the light which is emitted from the light source 24 and enters the front surface 22a of the translucent member 22 can be reflected by the front surface 22a. As a result, a utilization efficiency of a luminous flux can be enhanced.

In the present embodiment, the lamp unit 30 for forming the oblique cut-off line CL2 also has substantially the same configuration as the lamp unit 20. Hence, after the lamp unit 30 has been structured in low profile shape, the clear cut-off line CL2 can be formed.

In the embodiment, the lamp unit 40—which forms a scattering region of the low beam light distribution pattern P and auxiliary forms the horizontal cut-off line CL1—also has substantially the same configuration as that of the lamp unit 20. After the lamp unit 40 has been structured in low profile, formation of the scattering region and auxiliary formation of the horizontal cut-off line CL1 can be performed.

In the embodiment, all the twelve lamp units 20, 30, and 40 housed in the lamp chamber are structured in low profile. Therefore, an attempt can also be made to provide with the vehicle headlamp 10 in low profile shape.

In the present embodiment, the semi-spherical concaved section 22f which surrounds the illumination center of the light source 24 in a semi-spherical manner is formed in the center of the light source mount concaved section 22e formed in the rear surface 22b of the translucent member 22. Hence, the light emitting from the light source 24 can be caused to enter the translucent member 22 substantially perpendicularly. As a result, the light entering the translucent member 22 from the light source 24 can be caused to travel in a straight line without undergoing unintentional refraction at the boundary face. Hence, illumination light control of the lamp unit 20 can be facilitated. Moreover, internal space of the semi-spherical concaved section 22f is filled with the transparent resin 50. Hence, an air layer can be prevented from being interposed between the sealing resin member 24b of the light source 24 and the translucent member 24, thereby enhancing the utilization efficiency of a luminous flux while minimizing occurrence of reflection of light at the boundary face.

Figure 12:
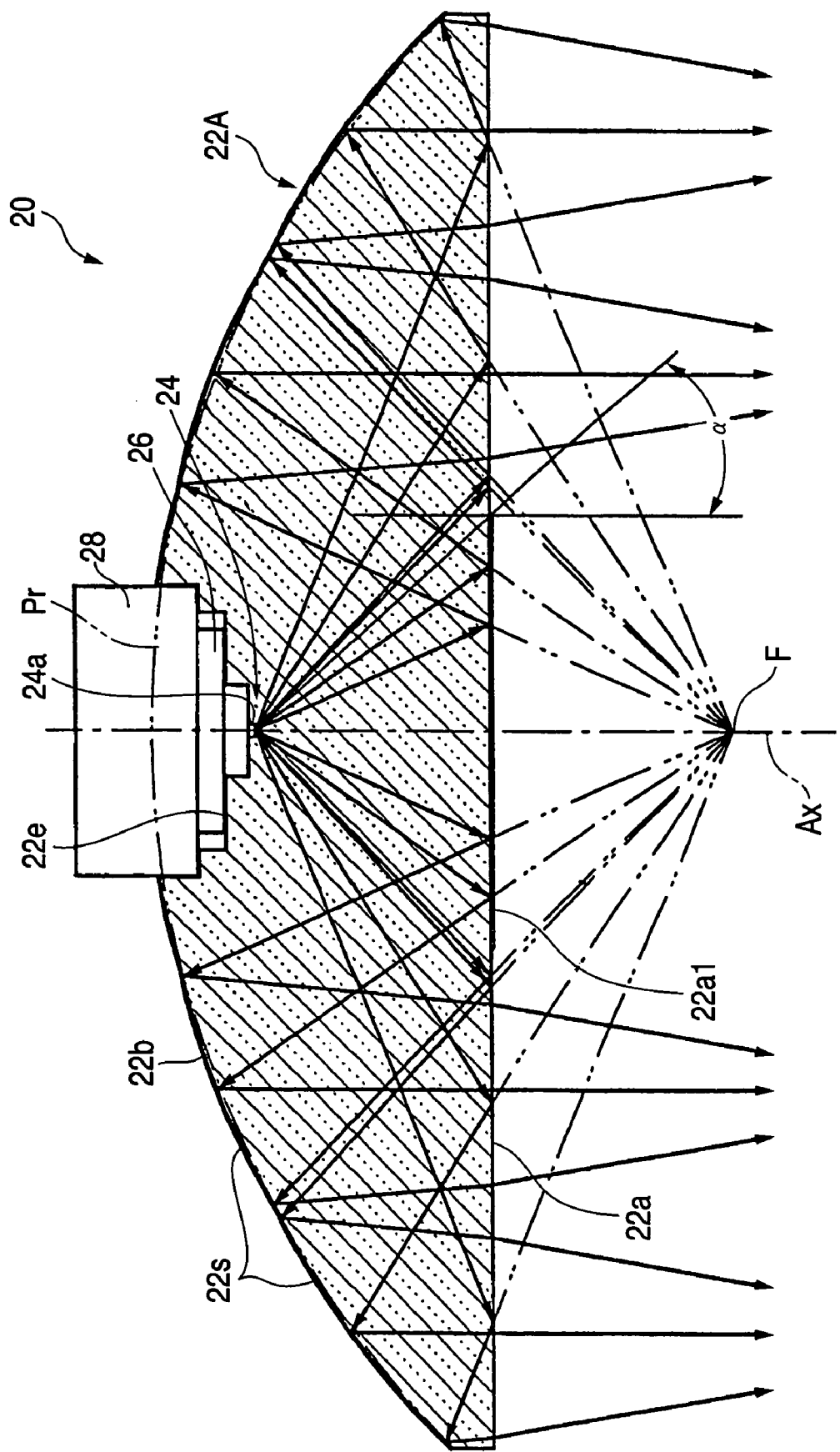
FIG. 12 is a view similar to FIG. 6, showing a modification of the embodiment.

In the lamp unit 20 of the present embodiment, the translucent member 22A of the light source 24 made of sealing resin, such as that shown in FIG. 12, can also be adopted in place of the translucent member 22. In the case of adoption of such a configuration, the lamp unit 20 can be formed in a more simple structure as a light source unit. Further, an air layer can be prevented from being interposed between the light-emitting chip 24a of the light source 24 and the translucent member 22A. Hence, a luminous flux from the light source can be utilized effectively.

The embodiment has described under the condition such that the four lamp units 20 disposed in the bottom row have the same configuration. However, radius curvatures of the reflection elements 22s of the respective lamp units 20 may be set to different values, thereby appropriately changing a scattering angle in the horizontal direction or the like. In the case of adoption of such a configuration, the horizontal cut-off line formation pattern P1 can be made to include more few inconsistencies in light. The same also applies to the four lamp units 30 arranged in the middle row and the four lamp units 40 arranged in the top row.

The embodiment has described that the twelve lamp units 20, 30, and 40 are arranged substantially at equal intervals in three rows such that four lamp units 20, four lamp units 30, and four lamp units 40 are arranged in the respective three rows. However, as a matter of course, the number and arrangement of the lamp units 20, 30, and 40 may be changed appropriately in accordance with a profile of a light distribution pattern, a luminous intensity distribution, those varied in their own design conditions.

What is claimed is:

1. A lamp unit, in a vehicle headlamp, for forming a linear portion of a cut-off line at an upper end of a light distribution pattern, the lamp unit comprising:
    a light source formed from a semiconductor light-emitting element having a light-emitting chip whose one side extends linearly; and
    a translucent member disposed so as to allow entry of light originating from said light source, wherein:
    said one side of said light emitting chip crosses an optical axis of said lamp unit at right angles;
    said one side of said light-emitting chip is aligned at a lower end section of said light-emitting chip;
    said translucent member is configured so as to subject incident light emitted from said light source to be reflected on a front surface of said translucent member and then reflected on a rear surface of said translucent member to exit from said front surface of said translucent member;

a front surface of said translucent member is formed from a plane orthogonal to said optical axis;

a rear surface of said translucent member comprises a light reflection control surface formed using a reference surface defined by a paraboloid of rotation whose focal point is a position having symmetry with an illumination center of said light source with reference to said front surface of said translucent member; and an area of said front surface of said translucent member located in the vicinity of said optical axis is subjected to mirror surface treatment, and a rear surface of said translucent member is subjected to mirror surface treatment.

2. The lamp unit according to claim 1, wherein said light reflection control surface is configured to cause light entering said light reflection control surface to be scattered, deflected, or reflected in a direction parallel to said one side of said light-emitting chip.

3. The lamp unit according to claim 1, wherein a position of an outer periphery of said area of said front surface of said translucent member located in the vicinity of said optical axis is set so as to assume a value which is substantially the same as a critical angle of said translucent member.

4. The lamp unit according to claim 1, wherein said translucent member is formed from a sealing resin member for sealing a light-emitting chip of said light source.

5. The lamp unit according to claim 2, wherein a position of an outer periphery of said area of said front surface of said translucent member located in the vicinity of said optical axis is set so as to assume a value which is substantially the same as a critical angle of said translucent member.

6. The lamp unit according to claim 5, wherein said translucent member is formed from a sealing resin member for sealing a light-emitting chip of said light source.

7. The lamp unit according to claim 2, wherein said translucent member is formed from a sealing resin member for sealing a light-emitting chip of said light source.

8. The lamp unit according to claim 3, wherein said translucent member is formed from a sealing resin member for sealing a light-emitting chip of said light source.

9. The lamp unit according to claim 1, wherein said light-emitting chip comprises a square shaped light emitting face, and said one side of said light-emitting chip is on a laterally adjacent side of the square shaped light emitting face.

10. The lamp unit according to claim 1, wherein said light-emitting chip is arranged in a concave portion of the translucent member.

11. A plurality of lamp units in a vehicle headlamp for forming linear portions of cut-off lines at an upper end of a light distribution pattern, the plurality of lamp units each comprising:

a light source formed from a semiconductor light-emitting element having a light-emitting chip whose one side extends linearly; and a translucent member disposed so as to allow entry of light originating from said light source, wherein:

said one side of said light emitting chip crosses an optical axis of said lamp unit at right angles;

said one side of said light-emitting chip is aligned at a lower end section of said light-emitting chip;

said translucent member is configured so as to subject incident light emitted from said light source to be reflected on a front surface of said translucent member and then reflected on a rear surface of said translucent member to exit from said front surface of said translucent member;

a front surface of said translucent member is formed from a plane orthogonal to said optical axis;

a rear surface of said translucent member comprises a light reflection control surface formed using a reference surface defined by a paraboloid of rotation whose focal point is a position having symmetry with an illumination center of said light source with reference to said front surface of said translucent member;

an area of said front surface of said translucent member located in the vicinity of said optical axis is subjected to mirror surface treatment, and a rear surface of said translucent member is subjected to mirror surface treatment;

a first one of the plurality of said lamp units is configured as a horizontal cut-off line formation lamp unit having, as said light source, a light source arranged such that one side of said light-emitting chip extends horizontally; and a second one of the plurality of said lamp units is configured as an oblique cut-off line formation lamp unit in which said one side of said light-emitting chip extends in a direction tilted at a angle with respect to a horizontal direction.

12. The lamp unit according to claim 11, wherein said light reflection control surface is configured to cause light entering said light reflection control surface to be scattered, deflected, or reflected in a direction parallel to said one side of said light-emitting chip.

13. The lamp unit according to claim 11, wherein a position of an outer periphery of said area of said front surface of said translucent member located in the vicinity of said optical axis is set so as to assume a value which is substantially the same as a critical angle of said translucent member.

14. The lamp unit according to claim 11, wherein said translucent member is formed from a sealing resin member for sealing a light-emitting chip of said light source.

15. The lamp unit according to claim 12, wherein a position of an outer periphery of said area of said front surface of said translucent member located in the vicinity of said optical axis is set so as to assume a value which is substantially the same as a critical angle of said translucent member.

16. The lamp unit according to claim 15, wherein said translucent member is formed from a sealing resin member for sealing a light-emitting chip of said light source.

17. The lamp unit according to claim 12, wherein said translucent member is formed from a sealing resin member for sealing a light-emitting chip of said light source.

18. The lamp unit according to claim 14, wherein said translucent member is formed from a sealing resin member for sealing a light-emitting chip of said light source.

19. The lamp unit according to claim 11, wherein said light-emitting chip comprises a square shaped light emitting face, and said one side of said light-emitting chip is on a laterally adjacent side of the square shaped light emitting face.

20. The lamp unit according to claim 11, wherein said light-emitting chip is arranged in a concave portion of the translucent member.

* * * * *